(12) United States Patent
An

(10) Patent No.: US 10,048,557 B1
(45) Date of Patent: Aug. 14, 2018

(54) LCD ARRAY SUBSTRATE, LCD PANEL AND LCD PIXEL CIRCUIT

(71) Applicant: Shenzhen China Star Optoelectronics Technology Co., Ltd., Shenzhen (CN)

(72) Inventor: Liyang An, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/524,661

(22) PCT Filed: Mar. 17, 2017

(86) PCT No.: PCT/CN2017/077090
§ 371 (c)(1),
(2) Date: May 5, 2017

(51) Int. Cl.
*G02F 1/1362* (2006.01)
*G02F 1/1368* (2006.01)
*G02F 1/1335* (2006.01)
*G02F 1/1333* (2006.01)

(52) U.S. Cl.
CPC ...... *G02F 1/136286* (2013.01); *G02F 1/1368* (2013.01); *G02F 1/13624* (2013.01); *G02F 1/133514* (2013.01); *G02F 2001/133397* (2013.01); *G02F 2001/136295* (2013.01); *G02F 2201/123* (2013.01)

(58) Field of Classification Search
CPC .................................................. G02F 1/13624
See application file for complete search history.

(56) References Cited

U.S. PATENT DOCUMENTS 9,146,435 B2 * 9/2015 Cho .................. G02F 1/136286

* cited by examiner

*Primary Examiner* — Kendrick Hsu

(57) ABSTRACT

An LCD array substrate, an LCD panel and an LCD pixel circuit are disclosed. The LCD array substrate includes: a substrate and a plurality of gate lines and data lines, wherein the gate lines and the data lines are crossed with each other to form a plurality of pixel units; each of the pixel units is provided with a pixel electrode, a first thin-film transistor, and a connecting switch controlled by the corresponding gate line; the switch is controlled to be turned on.

12 Claims, 3 Drawing Sheets

LCD ARRAY SUBSTRATE, LCD PANEL AND LCD PIXEL CIRCUIT

RELATED APPLICATIONS

This application is a National Phase of PCT Patent Application No. PCT/CN2017/077090 having International filing date of Mar. 17, 2017, which claims the benefit of priority of Chinese Patent Application No. 201710082276.2 filed on Feb. 15, 2017. The contents of the above applications are all incorporated by reference as if fully set forth herein in their entirety.

BACKGROUND OF THE INVENTION

Field of the Invention

The present invention relates to the technical field of liquid crystal display technology, and more particularly to an LCD array substrate, an LCD panel and an LCD pixel circuit.

Description of the Related Art

An LCD (Liquid Crystal Display) uses the change of electric field strength on liquid crystal molecules to change the orientation of the liquid crystal molecules so as to control the strength of light to display images. Currently, a liquid crystal display apparatus has been widely used in terminal display devices having any sizes due to its features of light-weight, small-volume and thin-thickness. An LCD is mainly formed by an array substrate and a color-filter substrate. The array substrate is provided with gate lines, data lines, pixel electrodes and thin-film transistors. Each of the pixel electrodes is controlled by the corresponding thin-film transistor. When the thin-film transistor is turned on, the pixel electrode is being charged during the turned-on time. After the thin-film transistor is turned off, the pixel electrode maintains its voltage until next scanning for recharging.

Due to a voltage coupling effect of the thin-film transistors, at the moment when an electric potential of a gate signal decreases from a high level, a pixel charging voltage will have a change of a voltage difference $\Delta V$. $\Delta V$ means a feed-through voltage. In general, a feed-through phenomenon is a problem that a liquid crystal panel may often encounter. The existence of feed-through phenomenon will cause a brightness difference between a frame of positive polarity frame and a frame of negative polarity, and then cause the panel to have a flicker problem and increase the risk of image sticking. Therefore, the feed-through voltage needs to be reduced by all means when designing the panel. The influence of a feed-through phenomenon performed on the pixel electric potential may be referred to $\Delta V=(V_{off}-V_{on}) \cdot C_{gs}/C_{total}$, wherein $V_{off}$ and $V_{on}$ are a turn-off voltage and a turn-on voltage of a scanning line as shown in FIG. 1; $C_{total}$ is the capacitor of the pixel electrode which generally includes three capacitors: $C_{total}=C_{gs}$ (parasitic capacitor of a TFT)+$C_{st}$ (storage capacitor)+$C_{lc}$ (liquid crystal capacitor). It can be seen from the foregoing formula that the value of $\Delta V$ can be lower by reducing $C_{gs}$ or increasing $C_{total}$. Generally, the feed-through voltage is reduced by a way of increasing $C_{st}$. The larger $C_{st}$ is, the less the amount of voltage coupling is. However, $C_{st}$ is usually limited by conditions such as an aperture ratio and thus cannot be made larger.

Therefore, the conventional technologies still have defects, and require more improvements.

SUMMARY OF THE INVENTION

An objective of the present invention is to provide an LCD array substrate and an LCD pixel circuit so as to solve the problem that the feed-through voltage may influence display quality in the conventional technology.

In order to solve the foregoing problem, the present invention provides a technical solution as follows:

The present invention provides an LCD array substrate including: a substrate and a plurality of gate lines and data lines, wherein the gate lines and the data lines are crossed with each other to form a plurality of pixel units; each of the pixel units is provided with a pixel electrode, a first thin-film transistor, and a connecting switch controlled by the corresponding gate line; the connecting switch is disposed between a pixel electrode of one pixel unit which is at the same column and at a preceding row in relation to the pixel unit where the connecting switch belongs and a pixel electrode of another pixel unit which is at the same column and at a following row in relation to the pixel unit where the connecting switch belongs; the connecting switch is controlled to be turned on so that the pixel electrode of one pixel unit which is at the same column and at a preceding row in relation to the pixel unit where the connecting switch belongs and the pixel electrode of another pixel unit which is at the same column and at a following row in relation to the pixel unit where the connecting switch belongs are electrically connected.

In the LCD array substrate of the present invention, the connecting switch is a second thin-film transistor; a gate of the second thin-film transistor is connected to a gate line in the pixel unit where the second thin-film transistor belongs, a source thereof is connected to a pixel electrode of an adjacent pixel unit which is at the same column and at a preceding row, and a drain thereof is connected to a pixel electrode of another adjacent pixel unit which is at the same column and at a following row.

In the LCD array substrate of the present invention, each of the pixel units is further provided with metallic lines; the source of the second thin-film transistor is connected to the pixel electrode of the adjacent pixel unit which is at the same column and at a preceding row through one of the metallic lines; the drain of the second thin-film transistor is connected to the pixel electrode of another adjacent pixel unit which is at the same column and at a following row through another one of the metallic lines.

In the LCD array substrate of the present invention, the metallic lines are ITO lines; the ITO lines are mounted in the same layer with the pixel electrodes.

In the LCD array substrate of the present invention, each of the pixel units further includes an M2 metal layer; the metallic lines are M2 metallic lines; the metallic lines are mounted in the same layer with the M2 metal layer.

The present invention further provides an LCD panel, the LCD panel includes a color-filter substrate, a liquid crystal layer, and an LCD array substrate; the color-filter substrate is mounted opposite to the LCD array substrate; the liquid crystal layer is mounted between the color-filter substrate and the LCD array substrate; the LCD array substrate includes a substrate and a plurality of gate lines and data lines, wherein the gate lines and the data lines are crossed with each other to form a plurality of pixel units; each of the pixel units is provided with a pixel electrode, a first thin-film transistor, and a connecting switch controlled by the corresponding gate line; the connecting switch is controlled to be turned on so that the pixel electrode of one pixel unit which is at the same column and at a preceding row in relation to the pixel unit where the connecting switch belongs and the pixel electrode of another pixel unit which is at the same column and at a following row in relation to the pixel unit where the connecting switch belongs are electrically connected.

The present invention further provides an LCD pixel circuit including: a plurality of gate lines, a plurality data lines, a plurality of pixel units defined by the gate lines and the data lines being crossed with each other; each of the pixel units includes: a first thin-film transistor, a capacitor; the capacitor is connected to one of the data lines through the first thin-film transistor; each of the pixel units further includes: a connecting switch being controlled by the corresponding gate line; the connecting switch controls the connection or disconnection of the drain of the first thin-film transistor of an adjacent pixel unit which is at the same column and at a preceding row in relation to the pixel unit where the connecting switch belongs and the drain of the first thin-film transistor of another adjacent pixel unit which is at the same column and at a following row in relation to the pixel unit where the connecting switch belongs.

In the LCD pixel circuit of the present invention, the connecting switch is a second thin-film transistor; a gate of the second thin-film transistor is connected to a gate line in the pixel unit where the second thin-film transistor belongs, a source thereof is connected to a drain of a first thin-film transistor of an adjacent pixel unit which is at the same column and at a preceding row, and a drain of the second thin-film transistor is connected to a drain of a first thin-film transistor of another adjacent pixel unit which is at the same column and at a following row.

In the LCD pixel circuit of the present invention, when an input to the gate line is at a high electric potential, the second thin-film transistor is turned on, the drain of the first thin-film transistor of the adjacent pixel unit which is at the same column and at a preceding row and the drain of the first thin-film transistor of the another adjacent pixel unit which is at the same column and at a following row are connected to each other.

In the LCD pixel circuit of the present invention, the capacitor includes a parasitic capacitor, a liquid crystal capacitor and a storage capacitor.

Compared with the conventional technology, each of the pixel units in the present invention is further added with a connecting switch that connects a pixel electrode of an adjacent pixel unit at the preceding row and a pixel electrode of another adjacent pixel unit at the following row so as to increase the overall capacitance, thereby further avoiding the occurrence of feed-through voltage and reducing the risk of image sticking.

DETAILED DESCRIPTION OF THE PREFERRED EMBODIMENTS

Figure 1:
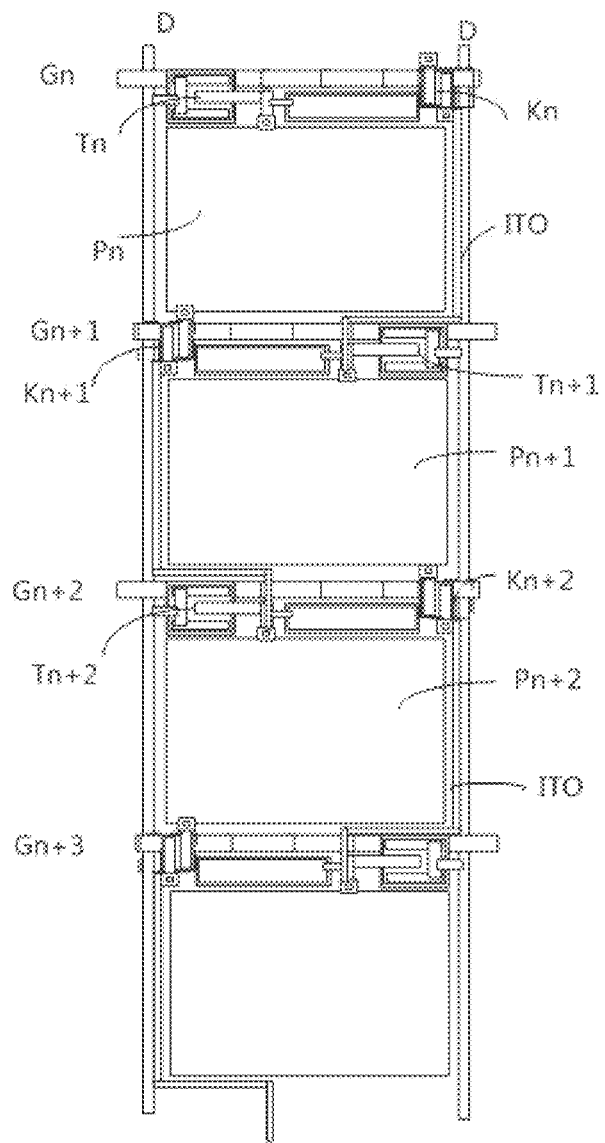
FIG. 1 is a plane view of an LCD array substrate according to a preferred embodiment of the present invention.

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, similar structural units are designated by the same reference numerals.

Please refer to FIG. 1, which is a plane view of an LCD array substrate according to a preferred embodiment of the present invention. The LCD array substrate includes: a substrate (not shown in the drawing), a plurality of gate lines (marked as $G_n, G_{n+1}, G_{n+2}, G_{n+3}, \ldots$), and a plurality of data lines (marked as $D_n, D_{n+1}, D_{n+2}, D_{n+3}, \ldots$). The gate lines and the data lines are crossed with each other to form a plurality of pixel units (presented as n, n+1, . . . ). Each of the pixel units (n) is provided with a pixel electrode $P_n$, a first thin-film transistor $T_n$, and a connecting switch $K_n$ controlled by the corresponding gate line. The connecting switch $K_n$ is disposed between a pixel electrode $P_{n-1}$ of one pixel unit (n−1) which is at the same column and at a preceding row in relation to the pixel unit (n) where the connecting switch $K_n$ belongs and a pixel electrode $P_{n+1}$ of another pixel unit (n+1) which is at the same column and at a following row in relation to the pixel unit (n) where the connecting switch $K_n$ belongs. The connecting switch $K_n$ may connect the pixel electrode $P_{n-1}$ of the pixel unit (n−1) which is at the same column and at a preceding row in relation to the pixel unit (n) where the connecting switch $K_n$ belongs and the pixel electrode $P_{n+1}$ of another pixel unit (n+1) which is at the same column and at a following row in relation to the pixel unit (n) where the connecting switch $K_n$ belongs. The turn-on or turn-off status of the connecting switch $K_n$ is controlled by inputting different electric potentials to the gate line $G_n$, thereby controlling the connection or disconnection between the pixel electrode $P_{n-1}$ of the pixel unit (n−1) which is at the same column and at a preceding row in relation to the pixel unit (n) where the connecting switch $K_n$ belongs and the pixel electrode $P_{n+1}$ of another pixel unit (n+1) which is at the same column and at a following row in relation to the pixel unit (n) where the connecting switch $K_n$ belongs. A gate of the first thin-film transistor $T_n$ is connected to the corresponding gate line Gn; a source thereof is connected to a corresponding data line; a drain thereof is connected to a pixel electrode $P_n$.

Furthermore, the connecting switch $K_n$ is preferably a second thin-film transistor $K_n$. The specific structure of the second thin-film transistor $K_n$ may be identical to the structure of the first thin-film transistor, but it is not limited thereto.

Specifically, a gate of the second thim-film transistor $K_n$ is connected to the corresponding gate line $G_n$; a source thereof is connected to a pixel electrode $P_{n-1}$ of an adjacent pixel unit (n−1) which is at the same column and at a preceding row, and a drain thereof is connected to a pixel electrode $P_{n+1}$ of another adjacent pixel unit (n+1) which is at the same column and at a following row.

In a preferred technical solution of this embodiment, the pixel unit is further provided with metallic lines L; the source of the second thin-film transistor is connected to the pixel electrode $P_{n-1}$ of the adjacent pixel unit (n−1) which is at the same column and at a preceding row through one of the metallic lines L; the drain of the second thin-film transistor is connected to the pixel electrode $P_{n+1}$ of another adjacent pixel unit (n+1) which is at the same column and at a following row through another one of the metallic lines L.

In a preferred technical solution of this embodiment, the metallic lines L are ITO lines. The ITO lines are mounted in the same layer with the pixel electrodes (as shown in FIG. 1); with the ITO lines, the connections of the pixel electrode at the preceding row and the pixel electrode at the following row are achieved.

Figure 2:
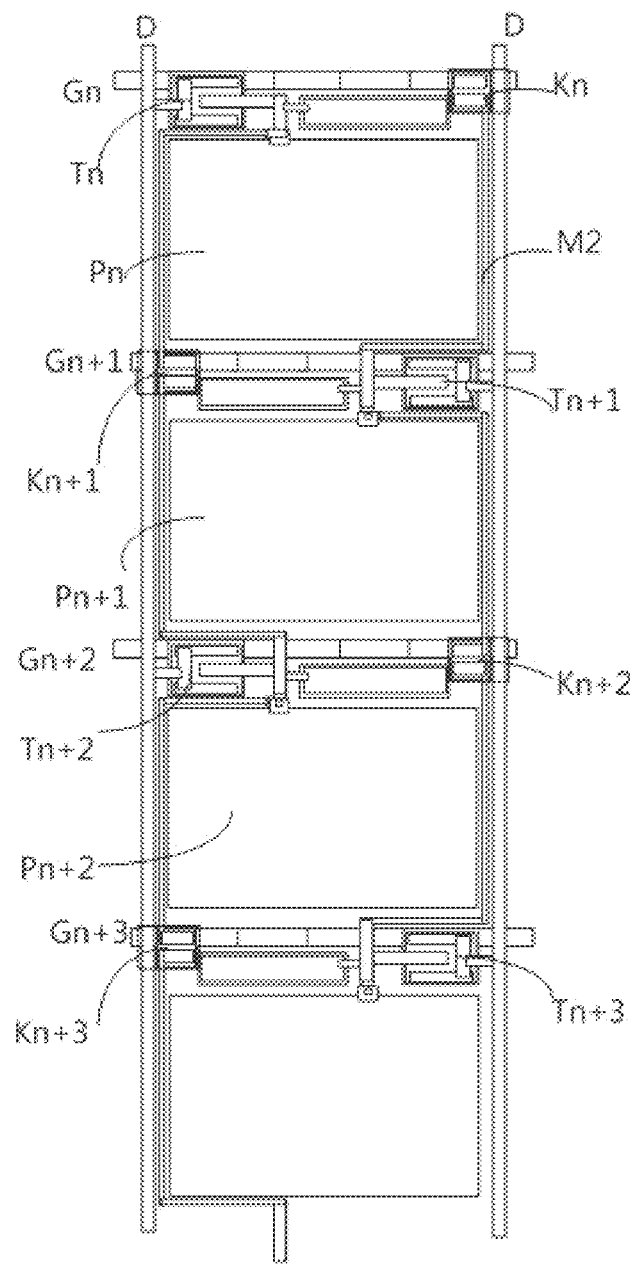
FIG. 2 is a plane view of an LCD array substrate according to another preferred embodiment of the present invention.

In another preferred technical solution of the present embodiment, as shown in FIG. 2, which is a plane view of an LCD array substrate according to another preferred embodiment of the present invention, the array substrate further includes an M1 metal layer (not shown in the drawing) and an M2 metal layer. The metallic lines are the M2 metallic lines. The metallic lines are mounted in the same layer with the M2 metal layer. With the M2 metallic lines, the connections of the pixel electrode at the preceding row and the pixel electrode at the following row are achieved.

In a preferred technical solution of this embodiment, as shown in FIGS. 1 and 2, the first thin-film transistor $T_n$ and the second thin-film transistor $K_n$ are mounted at two ends of the pixel unit n.

In this embodiment, the specific work principle of the array substrate is:

when charging the pixels at $G_n$ row, in a chronological order: $G_n$ is inputted with a high electric potential at a preceding period to perform a pre-charging; then $G_{n+1}$ is inputted with a high electric potential; then the data line $D_n$ is inputted with an image signal and starts to charge the pixel electrode $P_n$; since $G_{n+1}$ is currently at a high electric potential, the second thin-film transistor $K_{n+1}$ of the same pixel unit (n) is now turned on so that the pixel electrode $P_n$ and the pixel electrode $P_{n+2}$ are connected. At this time, the data line $D_n$ is charging four capacitors: $C_{lc}$ (liquid crystal capacitor) at the n-th row, $C_{st}$ (storage capacitor), $C_{lc}$ (liquid crystal capacitor) at the (n+2)th row, and $C_{st}$ (storage capacitor). Under a regular driving, the polarity at the n-th row and at the (n+2)th row are the same, therefore the charging is fast. $G_n$ is then closed, and the charging is finished; since at this time the second thin-film transistor $K_{n+1}$ is still turned on, the influence of a feed-through voltage will be equally shared by superposition of the four capacitors. When $G_{n+1}$ is closed, the second thin-film transistor $K_{n+1}$ is turned off, and the pixel electrode $P_n$ and the pixel electrode $P_{n+2}$ are disconnected, therefore the charging of the pixel electrode $P_{n+2}$ will not be affected. Since the feed-through voltage $\Delta V$ equals to $(V_{off}-V_{on}) \cdot C_{gs}/2*(C_{gs}+C_{st}+C_{lc})$, $\Delta V$ is much less than normal design.

In this embodiment, each of the pixel units is further added with a connecting switch that connects a pixel electrode of an adjacent pixel unit at the preceding row and a pixel electrode of another adjacent pixel unit at the following row so as to increase the overall capacitance, thereby further avoiding the occurrence of feed-through voltage and reducing the risk of image sticking.

The present invention further provides an LCD panel. The LCD panel includes a color-filter substrate, a liquid crystal layer, and an LCD array substrate; the color-filter substrate is mounted opposite to the LCD array substrate; the liquid crystal layer is mounted between the color-filter substrate and the LCD array substrate. The specific structure and work principle of the LCD array substrate are substantially the same as the description in the foregoing embodiment, and will not be described herein again to avoid redundancy.

In this embodiment, each of the pixel units is further added with a connecting switch that connects a pixel electrode of an adjacent pixel unit at the preceding row and a pixel electrode of another adjacent pixel unit at the following row so as to increase the overall capacitance, thereby further avoiding the occurrence of feed-through voltage and reducing the risk of image sticking.

Figure 3:
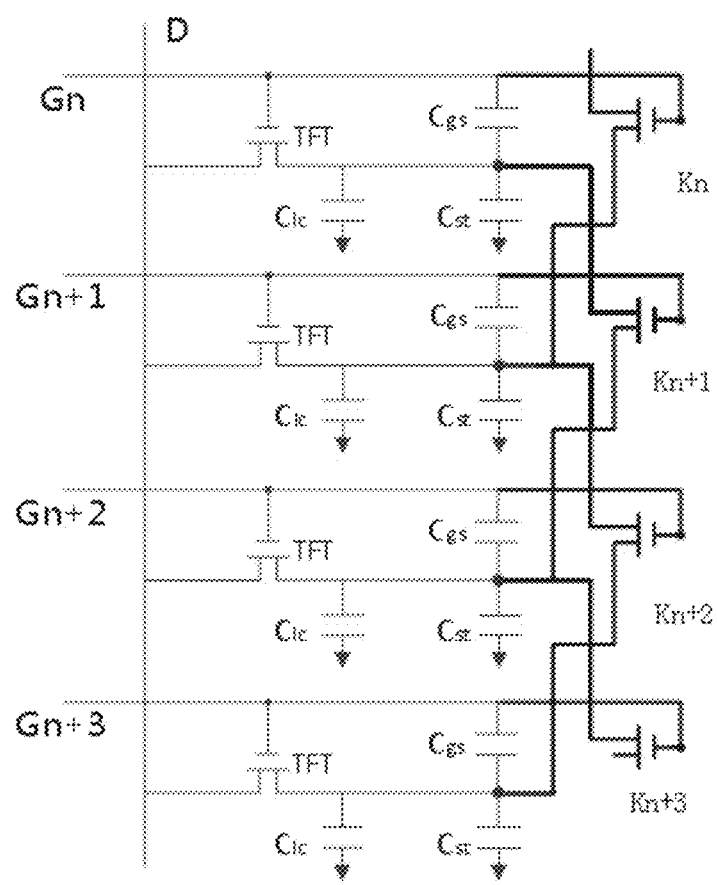
FIG. 3 is a partial circuit diagram of an LCD pixel circuit according to a preferred embodiment of the present invention.

The present invention further provides an LCD pixel circuit, as shown in FIG. 3, which is a partial circuit diagram of an LCD pixel circuit according to a preferred embodiment of the present invention. The LCD pixel circuit includes: a plurality of gate lines G (marked as $G_n$, $G_{n+1}$, $G_{n+2}$, $G_{n+3}$, ... ), a plurality of data lines D (marked as $D_n$, $D_{n+1}$, $D_{n+2}$, $D_{n+3}$, ... ), and a plurality of pixel units (n) defined by the gate lines and the data lines being crossed with each other; each of the pixel units includes: a first thin-film transistor TFT, a capacitor C; the capacitor C is connected to one of the data lines D through the first thin-film transistor TFT; each of the pixel units further includes: a connecting switch K being controlled by the corresponding gate line G. The connecting switch K may connect the pixel electrode $P_{n-1}$ of the pixel unit (n-1) which is at the same column and at a preceding row in relation to the pixel unit (n) where the connecting switch K belongs and the pixel electrode $P_{n+1}$ of another pixel unit (n+1) which is at the same column and at a following row in relation to the pixel unit (n) where the connecting switch K belongs. The turn-on or turn-off status of the connecting switch K is controlled by inputting different electric potentials to the gate line G, thereby controlling the connection or disconnection between the pixel electrode $P_{n-1}$ of the pixel unit (n-1) which is at the same column and at a preceding row in relation to the pixel unit (n) where the connecting switch K belongs and the pixel electrode $P_{n+1}$ of another pixel unit (n+1) which is at the same column and at a following row in relation to the pixel unit (n) where the connecting switch K belongs. A gate of the first thin-film transistor $T_n$ is connected to the corresponding gate line $G_n$; a source thereof is connected to a corresponding data line; a drain thereof is connected to a pixel electrode $P_n$.

Furthermore, the connecting switch $K_n$ is preferably a second thin-film transistor $K_n$. The specific structure of the second thin-film transistor $K_n$ may be identical to the structure of the first thin-film transistor, but it is not limited thereto.

Specifically, a gate of the second thim-film transistor $K_n$ is connected to the corresponding gate line $G_n$; a source thereof is connected to a pixel electrode $P_{n-1}$ of an adjacent pixel unit (n-1) which is at the same column and at a preceding row, and a drain thereof is connected to a pixel electrode $P_{n+1}$ of another adjacent pixel unit (n+1) which is at the same column and at a following row.

Specifically, the capacitor C includes a parasitic capacitor $C_{gs}$, a liquid crystal capacitor $C_{lc}$ and a storage capacitor $C_{st}$. An end of the parasitic capacitor $C_{gs}$ is connected to the corresponding gate line; another end of thereof is connected to the pixel electrode and the drain of the first thin-film transistor TFT. The parasitic capacitor $C_{gs}$, the liquid crystal capacitor $C_{lc}$ and the storage capacitor $C_{st}$ are all connected to the data line through the first thin-film transistor TFT.

The work principle of the pixel circuit of the embodiment is as follows:

when charging the pixels at $G_n$ row, in a chronological order: $G_n$ is inputted with a high electric potential at a preceding period to perform a pre-charging; then $G_{n+1}$ is inputted with a high electric potential; then the data line $D_n$ is inputted with an image signal and starts to charge the pixel electrode $P_n$; since $G_{n+1}$ is currently at a high electric potential, the second thin-film transistor $K_{n+1}$ of the same pixel unit (n) is now turned on so that the pixel electrode $P_n$ and the pixel electrode $P_{n+2}$ are connected. At this time, the data line $D_n$ is charging four capacitors: $C_{lc}$ (liquid crystal capacitor) at the n-th row, $C_{st}$ (storage capacitor), $C_{lc}$ (liquid crystal capacitor) at the (n+2)th row, and $C_{st}$ (storage capacitor). Under a regular driving, the polarity at the n-th row and at the (n+2)th row are the same, therefore the charging is fast. $G_n$ is then closed, and the charging is finished; since at this time the second thin-film transistor $K_{n+1}$ is still turned on, the influence of a feed-through voltage will be equally shared by superposition of the four capacitors. When $G_{n+1}$ is closed, the second thin-film transistor $K_{n+1}$ is turned off, and the pixel electrode $P_n$ and the pixel electrode $P_{n+2}$ are disconnected, therefore the charging of the pixel electrode $P_{n+2}$ will not be affected. Since the feed-through voltage $\Delta V$ equals to $(V_{off}-V_{on}) \cdot C_{gs}/2*(C_{gs}+C_{st}+C_{lc})$, $\Delta V$ is much less than normal design.

In the present invention, each of the pixel units is further added with a connecting switch that connects a pixel electrode of an adjacent pixel unit at the preceding row and a pixel electrode of another adjacent pixel unit at the following row so as to increase the overall capacitance, thereby further avoiding the occurrence of feed-through voltage and reducing the risk of image sticking.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. An LCD array substrate, comprising: a substrate and a plurality of gate lines and data lines, wherein the gate lines and the data lines are crossed with each other to form a plurality of pixel units; each of the pixel units is provided with a pixel electrode, a first thin-film transistor, and a connecting switch controlled by the corresponding gate line; the connecting switch is disposed between a pixel electrode of one pixel unit which is at the same column and at a preceding row in relation to the pixel unit where the connecting switch belongs and a pixel electrode of another pixel unit which is at the same column and at a following row in relation to the pixel unit where the connecting switch belongs; the connecting switch is controlled to be turned on so that the pixel electrode of the one pixel unit which is at the same column and at the preceding row in relation to the pixel unit where the connecting switch belongs and the pixel electrode of the another pixel unit which is at the same column and at the following row in relation to the pixel unit where the connecting switch belongs are electrically connected.

2. The LCD array substrate as claimed in claim 1, wherein the connecting switch is a second thin-film transistor; a gate of the second thin-film transistor is connected to a gate line in the pixel unit where the second thin-film transistor belongs, a source thereof is connected to a pixel electrode of an adjacent pixel unit which is at the same column and at a preceding row, and a drain thereof is connected to a pixel electrode of another adjacent pixel unit which is at the same column and at a following row.

3. The LCD array substrate as claimed in claim 2, wherein each of the pixel units is further provided with metallic lines; the source of the second thin-film transistor is connected to the pixel electrode of the adjacent pixel unit which is at the same column and at a preceding row through one of the metallic lines; the drain of the second thin-film transistor is connected to the pixel electrode of another adjacent pixel unit which is at the same column and at a following row through another one of the metallic lines.

4. The LCD array substrate as claimed in claim 3, wherein the metallic lines are ITO lines; the ITO lines are mounted in the same layer with the pixel electrodes.

5. The LCD array substrate as claimed in claim 3, wherein each of the pixel units further includes an M2 metal layer; the metallic lines are M2 metallic lines; the metallic lines are mounted in the same layer with the M2 metal layer.

6. An LCD panel, comprising a color-filter substrate, a liquid crystal layer and further comprising an LCD array substrate as claimed in claim 1, wherein the color-filter substrate is mounted opposite to the LCD array substrate; the liquid crystal layer is mounted between the color-filter substrate and the LCD array substrate.

7. An LCD pixel circuit, comprising: a plurality of gate lines, a plurality data lines, a plurality of pixel units defined by the gate lines and the data lines being crossed with each other; each of the pixel units includes: a first thin-film transistor, a capacitor; the capacitor is connected to one of the data lines through the first thin-film transistor; each of the pixel units further includes: a connecting switch being controlled by the corresponding gate line; the connecting switch controls the connection or disconnection of the drain of the first thin-film transistor of an adjacent pixel unit which is at the same column and at a preceding row in relation to the pixel unit where the connecting switch belongs and the drain of the first thin-film transistor of another adjacent pixel unit which is at the same column and at a following row in relation to the pixel unit where the connecting switch belongs.

8. The pixel circuit as claimed in claim 7, wherein the connecting switch is a second thin-film transistor; a gate of the second thin-film transistor is connected to a gate line in the pixel unit where the second thin-film transistor belongs, a source thereof is connected to a drain of a first thin-film transistor of an adjacent pixel unit which is at the same column and at a preceding row, and a drain of the second thin-film transistor is connected to a drain of a first thin-film transistor of another adjacent pixel unit which is at the same column and at a following row.

9. The pixel circuit as claimed in claim 8, wherein when an input to the gate line is at a high electric potential, the second thin-film transistor is turned on, the drain of the first thin-film transistor of the adjacent pixel unit which is at the same column and at a preceding row and the drain of the first thin-film transistor of the another adjacent pixel unit which is at the same column and at a following row are connected to each other.

10. The pixel circuit as claimed in claim 9, wherein the capacitor includes a parasitic capacitor, a liquid crystal capacitor and a storage capacitor.

11. The pixel circuit as claimed in claim 8, wherein the capacitor includes a parasitic capacitor, a liquid crystal capacitor and a storage capacitor.

12. The pixel circuit as claimed in claim 7, wherein the capacitor includes a parasitic capacitor, a liquid crystal capacitor and a storage capacitor.

* * * * *

UNITED STATES PATENT AND TRADEMARK OFFICE
CERTIFICATE OF CORRECTION

PATENT NO. : 10,048,557 B1  
APPLICATION NO. : 15/524661  
DATED : August 14, 2018  
INVENTOR(S) : Liyang An Page 1 of 1

It is certified that error appears in the above-identified patent and that said Letters Patent is hereby corrected as shown below:

On the Title Page

Add Item (30) Foreign Application Priority Data:
-- Feb. 15, 2017 (CN).................201710082276.2 --

Signed and Sealed this  
Sixteenth Day of October, 2018

Andrei Iancu  
*Director of the United States Patent and Trademark Office*